United States Patent [19]

Kawamoto et al.

[11] Patent Number: 5,298,776
[45] Date of Patent: Mar. 29, 1994

[54] CCD LINE SENSOR

[75] Inventors: Seiichi Kawamoto; Maki Sato; Tadakuni Narabu; Hisanori Miura; Masahide Hirama, all of Kanagawa, Japan

[73] Assignee: Sony Corporation, Tokyo, Japan

[21] Appl. No.: 677,120

[22] Filed: Mar. 29, 1991

[30] Foreign Application Priority Data

Mar. 29, 1990 [JP] Japan ................................. 2-081706

[51] Int. Cl.5 ............................................. H01L 29/78
[52] U.S. Cl. ..................................... 257/222; 257/236
[58] Field of Search .................. 357/24; 257/222, 225, 257/228, 229, 236, 237, 238

[56] References Cited

U.S. PATENT DOCUMENTS

| | | | |
|---|---|---|---|
| 4,173,765 | 11/1979 | Heald et al. | 257/291 |
| 4,375,086 | 2/1983 | van Velthoven | 257/236 |
| 4,500,924 | 2/1985 | Ohta | 257/445 |

Primary Examiner—Rodney B. Bovernick
Assistant Examiner—Robert E. Wise
Attorney, Agent, or Firm—Hill, Steadman & Simpson

[57] ABSTRACT

A solid state imager element has a sensor portion, a register portion and a read gate portion for reading a signal charge from the sensor portion and transferring the same to the register portion, wherein a potential difference is formed in the read gate portion in a reading and transferring direction for directing an unnecessary charge or noise toward the register portion to thereby suppress noise in the sensor portion.

4 Claims, 3 Drawing Sheets

CCD LINE SENSOR

BACKGROUND OF THE INVENTION

1. Field of the Invention

The present invention relates to a solid state imager element composed of a CCD (change coupled device) suitable for use in a two-dimensional sensor (so-called imager), a linear sensor and so on.

2. Description of the Prior Art

A CCD solid state imager element used for a linear sensor, a two-dimensional sensor and so on is composed of a sensor portion 1, a read gate portion 3 having a gate electrode 2 and a register portion 5 having a transfer electrode 4 in a CCD structure, as shown in, for example, a potential diagram of FIG. 1. In this CCD solid state imager element, a signal charge 6 in the sensor portion 1 is read out, transferred to the register portion 5 through the read gate portion 3 and transferred through the register portion 5 to be finally outputted. Read-out and transfer of the signal charge in the example shown in FIG. 1 is performed such that the read gate portion 3 is turned on once to accummulate therein the signal charge 6 in the sensor portion 1 and then turned off to read out the signal charges 6 to the register portion 5. Alternatively, a signal read-out and transfer method as shown in FIG. 2 is also known where the read gate portion 3 is turned on to immediately read out the signal charge 6 in the sensor portion 1 to the register portion 5.

Generally, the output portion delivers outputs such that an output when no signal charge is transferred to the register 5 is determined to be a zero level.

Incidentally, in a linear sensor, the sensor portion 1 corresponds to a line sensor portion of the linear sensor while the register portion 5 to an output shift register portion disposed in parallel with the line sensor portion in the examples of FIGS. 1 and 2. Also, in a two-dimensional sensor, the sensor portion 1 corresponds to a sensor portion aligned in two dimension, and the register portion 5 to a vertical shift register portion disposed on one side of respective columns of the sensor portion for vertically transferring the signal charges from the sensor portion.

In the above-mentioned conventional solid state imager element, there arises a problem that unnecessary charges 6a or noise generated on the surface of the read gate portion 3, when the read gate portion 3 is off, that is, during light receiving periods, penetrates the sensor portion 1. For this reason, the noise generated in the read gate portion 3 is read out and transferred to the register portion 5 in addition to the signal charges generated in the sensor portion 1. Therefore, when a noise measurement is made in a normal condition (a difference between an output derived when no signal charge is transferred to the register 5 and an output derived when signal charges are read out of the sensor portion 1 and then transferred via the register portion 5 is measured in a dark place), the noise generated in the read gate portion 3 appears as it is as noise of the solid state imager element.

OBJECTS AND SUMMARY OF THE INVENTION

Accordingly it is an object of the present invention to provide an improved solid state imager element which can eliminate the aforenoted shortcomings and disadvantages of the prior art.

More specifically, it is an object of the present invention to provide a solid state imager element suitable for use in a two-dimensional sensosr, a linear sensor and so on which is capable of reducing noise generated in the sensor portion.

According to an aspect of the present invention, a solid state imager device is comprised of a sensor portion, a register portion, a read gate portion for reading out a signal charge from the sensor portion and transferring the same to the register portion, and a potential difference formed in the read gate portion in a direction in which the signal charge is read out and transferred.

The above and other objects, features, and advantages of the present invention will become apparent from the following detailed description of a illustrative embodiment thereof to be read in conjunction with the accompanying drawings, in which like reference numerals represent the same or similar parts.

DESCRIPTION OF THE PREFERRED EMBODIMENT

An embodiment of a CCD solid state imager element according to the present invention will hereinafter be described with reference to FIGS. 3 and 4.

Figure 3:
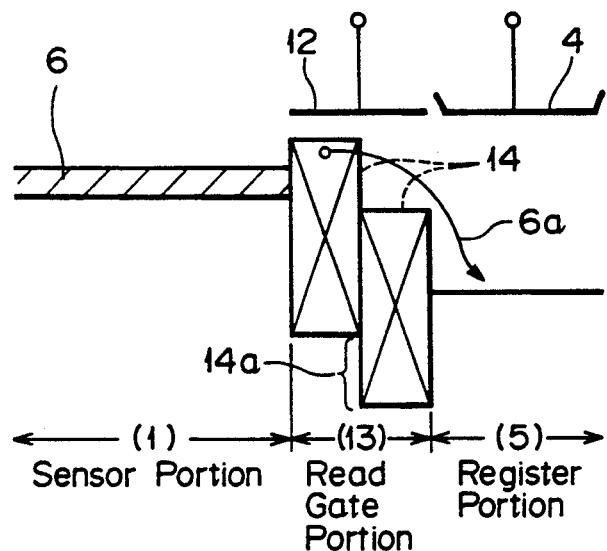
FIGS. 3 and 4 are diagrams respectively showing the potential level of a main portion of a solid state imager element according to the present invention.

The CCD solid state imager element of the present embodiment comprises a sensor portion 1 corresponding to a pixel, a register portion 5 in a CCD structure having a transfer electrode 4, a read gate portion 13 having a gate electrode 12 for reading a signal charge 6 from the sensor portion 1 and transferring the same to the register portion 5, wherein the read gate portion 13 is formed with a potential difference 14 which has a potential well gradually deeper in the signal charge transferring direction, as shown in FIG. 3. The formation of the potential difference 14 is achieved by, for example, providing a difference in the thickness of a gate insulating layer disposed beneath the gate electrode 12 or providing a difference in the concentration on the surface of the semiconductor substrate beneath the gate electrode 12.

In the method shown in FIG. 3, the read gate portion 13 is once turned on to accummulate therein the signal charge 6 generated in the sensor portion 1 and then turned off to read out the same to the register portion 5.

In a manner similar to the aforementioned example, when the solid state imager element of the present embodiment is applied to a linear sensor, the sensor portion 1 corresponds to a line sensor portion of the linear sensor, and the register portion 5 to an output shift register portion disposed in parallel with the line sensor portion. Also, when the present embodiment is applied to a two-dimensional sensor, the sensor portion 1 corresponds to sensor portions of the two-dimensional sensor which are aligned in two dimension, and the register portion 5 to a vertical shift register portion disposed on one side of the sensor portions of the two-dimentional sensor for transferring the signal charges from the sensor portion in the vertical direction.

According to such a structure, almost all of an unnecessary charge 6a which is generaged on the surface of the read gate portion 13, when the read gate portion 13 is off, is always transferred to the register portion 5 by means of the potential difference 14. For this reason, the unnecessary charge 6a generaged in the read gate portion 13 is not measured as noise generated in the sensor portion 1.

Figure 1:
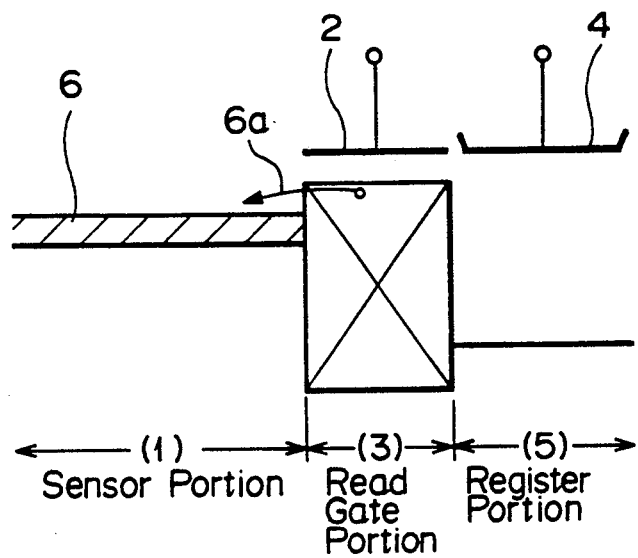
FIGS. 1 and 2 are diagrams respectively showing the potential level of a main portion of the conventional solid state imager element.
Figure 2:
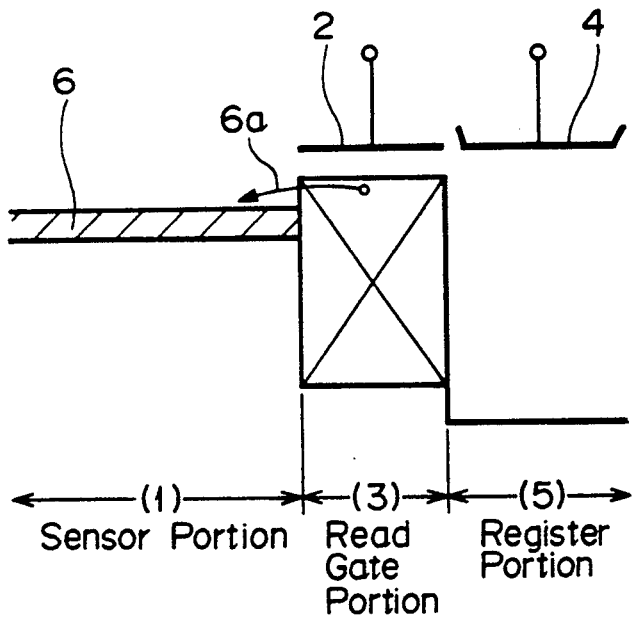

In FIG. 1, the read out gate portion 13 is turned on, and then the signal charge 6 generated in the sensor portion 1 is once accummulated in the turned-on read gate portion 13, wherein the unnecessary charge 6a generated in the read gate portion 13 during this accummulating period is to be added to the signal charge 6. Since the potential at the read gate portion 13 formed in the embodiment of the present invention has the potential difference 14, the amount of the accummulated charges is increased by an increase 14a in depth of the potential well, in comparison with the prior art example shown in FIG. 1. Therefore, if the charge accummulating amount is equal to the aforementioned prior art example, the area of the read gate portion 13 can be reduced, which leads to a decrease in the generation of the unnecessary charge 6a by the amount corresponding to the reduced area of read gate portion 13. As a result, the unnecessary charge 6a added to the signal charge 6 during the accummulating period is reduced, and hence overall noise generated in the sensor portion can be suppressed.

Figure 4:
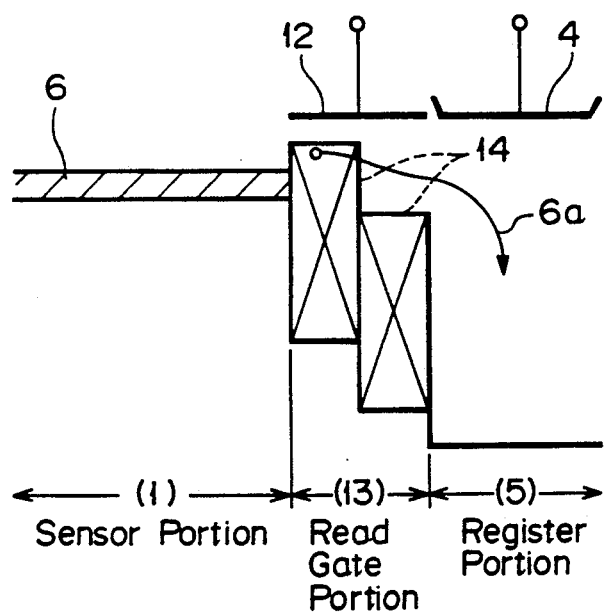

FIG. 4 shows that the present invention is applied to a solid state imager element where the read gate portion 13 is turned on to immediately read out and transfer the signal charge 6 in the sensor portion 1 to the register portion 5. Also in such a transfer system, the unnecessary charge 6a generated when the read gate portion 13 is off almost flows into the register portion 5 in the same manner as described above. Therefore, the unnecessary charge 6a generated in the read gate portion 13 is not measured as noise of the sensor portion 1, with the result that noise in the sensor portion 1 can be suppressed.

As described above, the solid state imager element of the present invention is remarkably effective in suppressing noise in the sensor portion by virtue of the potential difference formed in the read gate portion between the sensor portion and the register portion and accordingly suitable for use in the two-dimensional sensor, linear sensors and so on.

Figure 5:
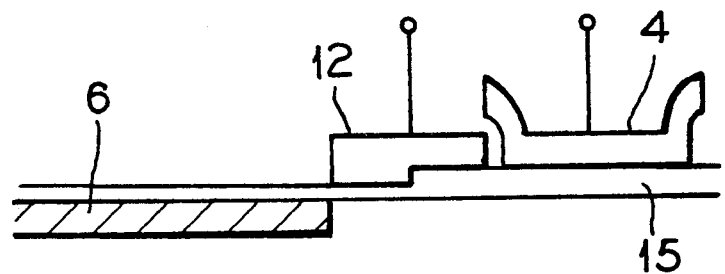
FIG. 5 is a cross sectional view of one embodiment of the present invention.
Figure 5:
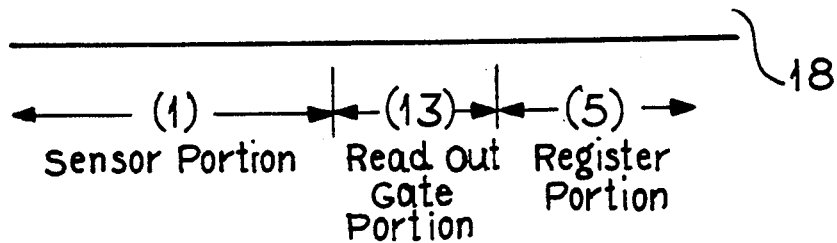

FIG. 5 illustrates a cross sectional view of an embodiment of the present invention, corresponding to FIG. 3. An insulator layer 15 overlies the substrate and the sensor portion, and underlies the electrodes 12 and 4.

The gate electrode 12 is formed with a stepped lower surface, adjacent the insulating layer 15, wherein there is a lesser thickness of the insulating layer 15 underneath the gate electrode 12 in the area nearest the sensor portion 1, and a greater thickness in the area adjacent the register portion 5.

Figure 6:
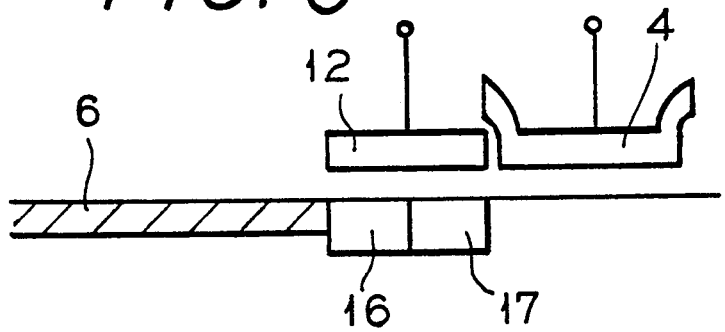
FIG. 6 is a cross sectional view of another embodiment of the present invention.
Figure 6:
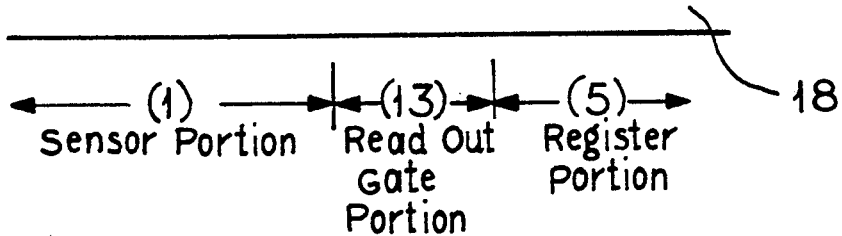

FIG. 6 illustrates an alternative embodiment of the present invention, corresponding to the arrangement of FIG. 4. In this embodiment, the upper surface of the substrate 18, adjacent the sensor portion 1, is provided with two semiconductor zones 16 and 17 of different semiconductor concentration. For both FIGS. 5 and 6, the potential difference 14 is generated, by the difference in the thickness of the gate insulating layer, or by the difference in the concentration beneath the gate electrode 12.

Having described a preferred embodiment of the invention with reference to the accompanying drawings, it is to be understood that the invention is not limited to that precise embodiment and that various changes and modifications thereof could be effected by one skilled in the art without departing from the spirit or scope of the novel concepts of the invention as defined in the appended claims.

We claim as our invention:

1. A solid state imager element comprising;
   a sensor portion;
   a register portion;
   a read gate portion for reading out a signal charge from said sensor portion and transferring the same to said register portion; and
   a potential difference formed in said read gate portion in a direction in which said signal charge is read out and transferred, so that unnecessary charges generated in said read gate portion flow into said register portion.

2. A solid state imager element according to claim 1, wherein said read gate portion includes a gate electrode and said register portion includes a transfer electrode.

3. A solid state imager element according to claim 2, wherein said potential difference is formed by a difference in thickness of a gate insulating layer beneath said gate electrode.

4. A solid state imager element comprising;
   a sensor portion;
   a register portion;
   a read gate portion for reading out a signal charge from said sensor portion and transferring the same to said register portion; and
   a potential difference formed in said read gate portion in a direction in which said signal charge is read out and transferred, said potential difference being formed by a difference in concentration of the surface of a semiconductor substrate beneath said gate electrode.

* * * * *